United States Patent [19]

Yoder

[11] Patent Number: 5,734,300

[45] Date of Patent: Mar. 31, 1998

[54] OPTICAL RECEIVER PREAMPLIFIER DYNAMIC RANGE ENHANCING CIRCUIT AND METHOD

[75] Inventor: James Daniel Yoder, Manheim Township, Lancaster County, Pa.

[73] Assignee: Lucent Technologies, Inc., Murray Hill, N.J.

[21] Appl. No.: 650,276

[22] Filed: May 17, 1996

[51] Int. Cl.$^6$ .............................. H03F 3/08; H04B 10/06
[52] U.S. Cl. .................... 330/308; 250/214 A; 359/194
[58] Field of Search ................ 330/59, 308; 250/214 A; 359/189, 194

[56] References Cited

U.S. PATENT DOCUMENTS

| | | | |
|---|---|---|---|
| 3,968,361 | 7/1976 | Bumgardner | 359/189 X |
| 4,415,803 | 11/1983 | Muoi | 250/214 A |
| 4,498,001 | 2/1985 | Smoot | 250/214 A |
| 4,540,952 | 9/1985 | Williams | 330/279 |
| 4,565,974 | 1/1986 | Smoot | 330/304 |
| 4,608,542 | 8/1986 | Siegel | 330/279 |
| 4,731,529 | 3/1988 | Ohsawa | 330/308 X |
| 5,008,524 | 4/1991 | Reutter et al. | 250/214 A |
| 5,012,202 | 4/1991 | Taylor | 250/214 |
| 5,442,321 | 8/1995 | Bayruns et al. | 330/282 |

*Primary Examiner*—James B. Mullins
*Attorney, Agent, or Firm*—Scott W. McLellan

[57] ABSTRACT

A preamplifier overload control circuit which enhances the dynamic range of the preamplifier. Separate paths shunt corresponding DC and AC components of the signal from an electro-optical device away from the preamplifier input. The amount of shunting in both paths are controlled by a common control signal, here the average DC value of the signal, such that substantially all of the DC signal is shunted away from the preamplifier input.

16 Claims, 2 Drawing Sheets

5,734,300

1

OPTICAL RECEIVER PREAMPLIFIER DYNAMIC RANGE ENHANCING CIRCUIT AND METHOD

BACKGROUND OF THE INVENTION

1. Field of the Invention

This invention relates to transimpedance amplifiers in general and, more particularly, to transimpedance preamplifiers used as preamplifiers in optical systems.

2. Description of the Prior Art

Optical receivers generally use preamplifiers to boost the very low level signal from the optical detector (e.g., a photodiode) prior to further processing in the receiver. The optical signal strength that the receiver must handle without error due to noise (minimum received power) and overload (maximum received power) is typically 30 dB or more. Without compensating for the large variation in signal levels, the preamplifier becomes saturated at the high signal levels if the gain of the preamplifier is high enough to reliably amplify the weak signals. Prior art attempts to compensate the preamplifier have have met with limited success because compensation of the preamplifier was done with a single shunt path that did not allow for independent control of the DC portion from the AC portion. See, for example, U.S. Pat. No. 4,498,001 assigned to the same assignee as this invention and incorporated herein by reference.

Therefore, it is desirable to provide a preamplifier design that allows for the independent adjustment of the magnitude of the DC and AC components of the signal being amplified to obtain a wide dynamic range.

Further, it is desirable to provide the independent adjustment by using a single control signal for both components.

SUMMARY OF THE INVENTION

This and other aspects of the invention may be obtained generally in a preamplifier circuit responsive to a signal from an electro-optical detector coupling to an input of the preamplifier, the signal having a DC portion and an AC portion. A variable DC shunt path coupling to the input of the preamplifier, shunts an amount of current proportional to the DC portion of the signal from the detector away from the preamplifier input. Further, a variable impedance AC shunt path, separate from the DC shunt path and coupling to the input of the preamplifier, has an impedance proportional to the DC portion of the signal from the detector. The AC shunt path shunts a variable amount of the AC portion of the signal away from the input of the preamplifier. The combination of the separate shunt paths serves to enhance the dynamic range of the preamplifier.

Alternatively, the aspects of the invention may be obtained generally with a method of enhancing the dynamic range of an optical receiver preamplifier in an optical system, the receiver having an electro-optical detector coupling to the input of the preamplifier, the preamplifier amplifying a signal from the detector, the signal having a DC portion and an AC portion. The DC current is shunted away from the input of the preamplifier in proportion to the DC portion of the signal from the detector. Further, an amount of the AC signal is shunted away from the input of the preamplifier in proportion to the DC portion of the signal from the detector.

BRIEF DESCRIPTION OF THE DRAWING

The foregoing features of this invention, as well as the invention itself, may be more fully understood from the following detailed description of the drawings, in which.

DETAILED DESCRIPTION

Figure 1:
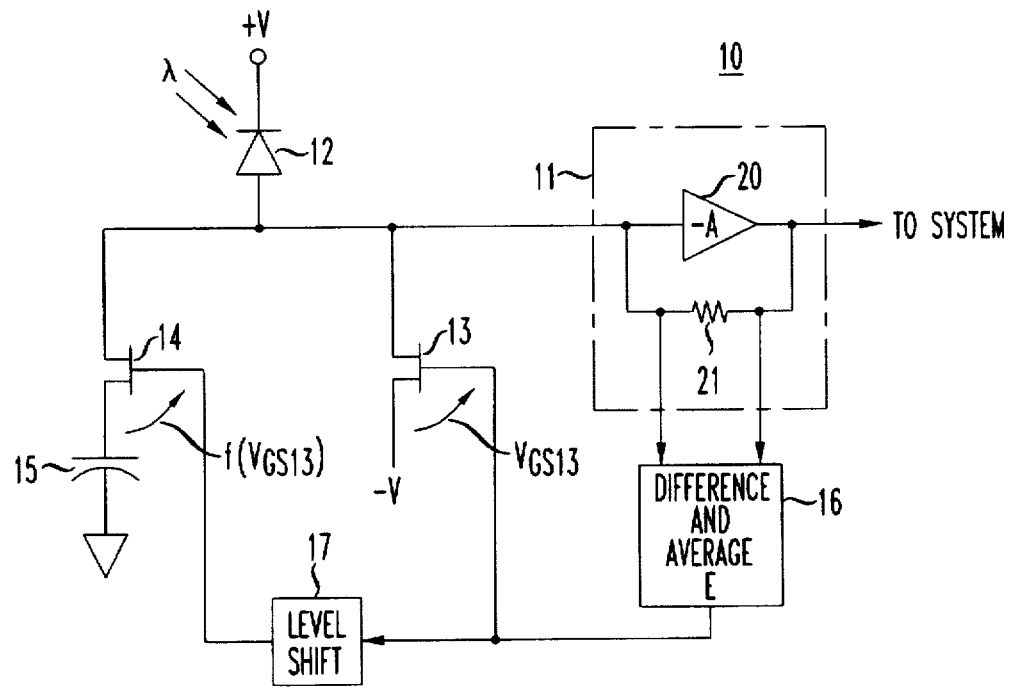
FIG. 1 is an exemplary block diagram of a preamplifier in an optical receiver which is part of an optical communication system, according to one embodiment of the invention.

Generally, the invention may be understood by referring to FIG. 1. As discussed below in more detail and in accordance with one embodiment of the invention, a preamplifier circuit 11, part of an optical receiver 10 in an optical communication system (not numbered), is responsive to a signal from an electro-optical detector 12 coupling to the input of the preamplifier 11, the signal having a DC portion and an AC portion. A variable DC shunt path 13 coupling to the input of the preamplifier, shunts an amount of current proportional to the DC portion of the signal from the detector away from the preamplifier input. Further, a variable impedance AC shunt path 14 and 15, separate from the DC shunt path 13 and coupling to the input of the preamplifier, has an impedance proportional to the DC portion of the signal from the detector. The AC shunt path shunts a variable amount of the AC portion of the signal away from the input of the preamplifier 11.

In more detail, the optical receiver 10 has a preamplifier 11 having an amplifier 20 and feedback impedance 21 (represented as a resistor but can include compensation capacitors as necessary). The combination of amplifier 20 and impedance 21 form a transimpedance amplifier but can be of any amplifier topology that utilize a feedback resistor for purposes of the disclosed embodiment. The preamplifier 11 amplifies signals from the electro-optical device 12, shown here as a PIN photodiode or APD. The output of the preamplifier 11 additionally drives further circuitry (not shown) in the optical communication system.

The signal from the device 12 has both a DC component and an AC component. The DC component is, for purposes here, the average value of the current from the device 12 and the AC component is generally referred to as the information received from the optical signal coupled to the device 12. DC shunt path formed by FET 13 operates as a current sink with a substantially large AC impedance. This is achieved by having FET 13 operate in the saturated region of its electrical characteristics. It is understood that other approaches may be used to provide the current sink function.

The amount of current conducted by FET 13 is controlled by circuit 16 which detects the average voltage across impedance 21. For purposes here and as will be explained in more detail in connection with FIG. 2, the average voltage across feedback impedance 21 represents the average current (DC portion) from the device 12. For purposes here, there is no substantial bias current flowing into amplifier 20 but is not limited to a no bias design and the advantages of the invention are still applicable.

The FET 13, amplifier 20, impedance 21, and circuit 16 forms a closed control loop that removes a portion of the average (DC) current from device 12 before it enters preamplifier 11. Preferably, substantially all of the DC current is shunted by FET 13.

The AC shunt path of FET 14 and series DC-blocking capacitor 15 operate as a variable resistance without affecting the DC voltage on the input of the preamplifier 11. The resistance of FET 14 varies in proportion to the gate-to-source voltage $V_{GS}$ on FET 14 operating in the ohmic or triode region. The resistance of FET 14 is substantially determined by the same control signal used to control FET 13. In the preferred embodiment, the control signal used on FET 13 is the gate-to-source voltage thereof ($V_{GS13}$) and this signal controls the gate-to-source voltage of FET 14 ($V_{GS14}$) and may be any function f thereof. Preferably, the gate-to-source voltages are substantially equal by virtue of level shift 17, described below, and that FETs 13, 14 are fabricated in a common substrate such that the characteristics of the FETs are substantially the same and track with temperature, etc. The size of FET 14, along with the gate-to-source voltage thereof, substantially determines the resistance of the FET 14. Advantageously, the size of FET 14, the size ratio between FETs 13 and 14, and the transfer function of the control signal from circuit 16 to FET 14 may be adjusted depending on the expected received data waveforms so that the performance of the receiver 10 may be optimized for the expected range of amplitudes in the received signals. For further information and details, see U.S. Pat. No. 4,540,952, assigned to the same assignee as this invention and incorporated herein by reference. For purposes here, the size of FET 14 is set such that for the maximum expected signal, the preamplifier 11 does not overload.

Figure 2:
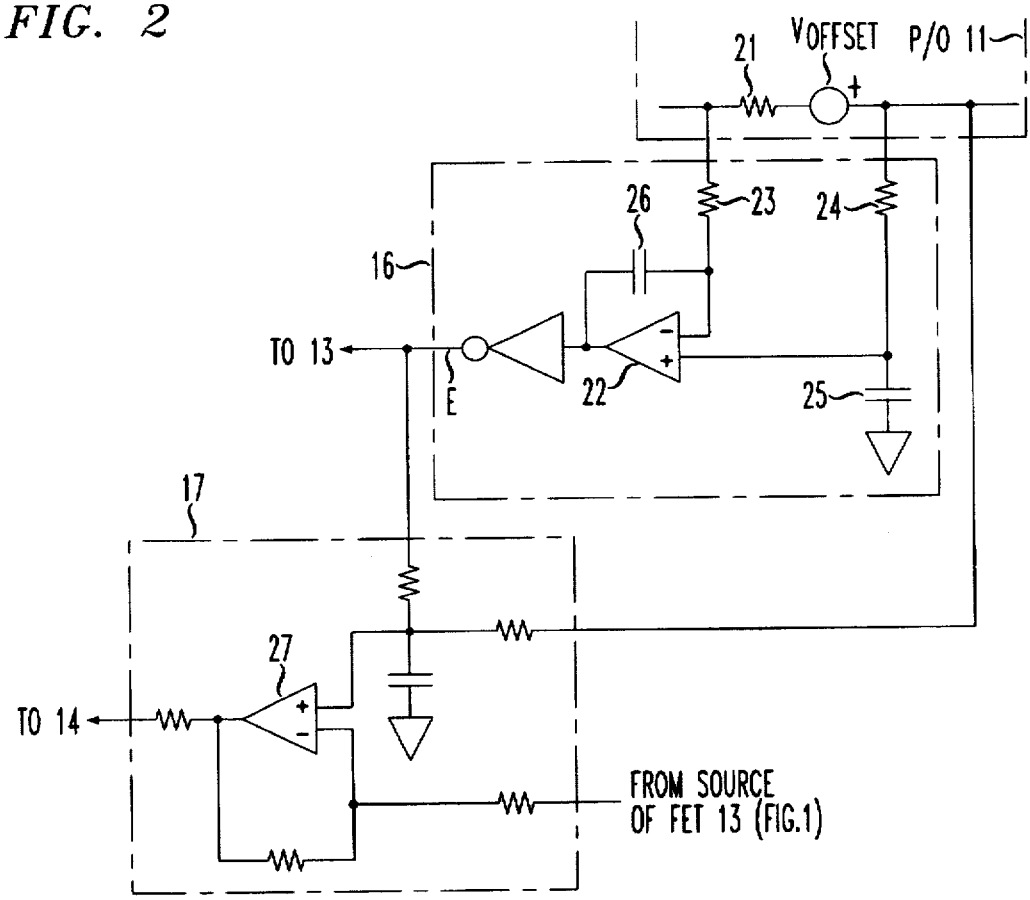
FIG. 2 is an exemplary circuit diagram of a portion of the preamplifier control circuits shown in FIGS. 1 and 3.

In this embodiment, level shift circuit 17 translates the gate-source-voltage of FET 13 to an appropriate value such that FET 14 has the same gate-to-source voltage of FET 13. Referring to FIG. 2, level shift circuit 17 takes the gate-source-voltage of FET 13 and adds to it the voltage on the output of the preamplifier 11. That voltage is substantially equal to the drain voltage of FET 13 because the voltage across impedance 21 is substantially zero by virtue of the closed control loop described above. It is understood that other types of level shifting techniques can be used as well as circuitry to provide a desired transfer function f, described above.

The difference and average circuit 16 of FIG. 1 is shown in more detail in FIG. 2. Ignoring optional voltage source $V_{OFFSET}$, the voltage across impedance 21 is detected by amplifier 22 via resistors 23, 24, which typically have a much higher resistance (approximately 10× or more) than the resistance of impedance 21. Capacitors 25, 26 serve to have amplifier 22 operate as a low pass filter to average the voltage across impedance 21, and hence, the current from device 12 (FIG. 1). The output of the circuit 16, E, is an error signal used as part of the above-described closed control loop to control the current conducted by FET 13.

The voltage source $V_{OFFSET}$ provides a threshold offset above which the signal current from device 12 must exceed before the circuit 16 operates. Thus, the FETs 13, 14 are substantially non-conducting at received signal levels below the threshold. This provides for reducing the loading of the shunt elements from adversely affecting the sensitivity of the preamplifier at low signal levels.

Figure 3:
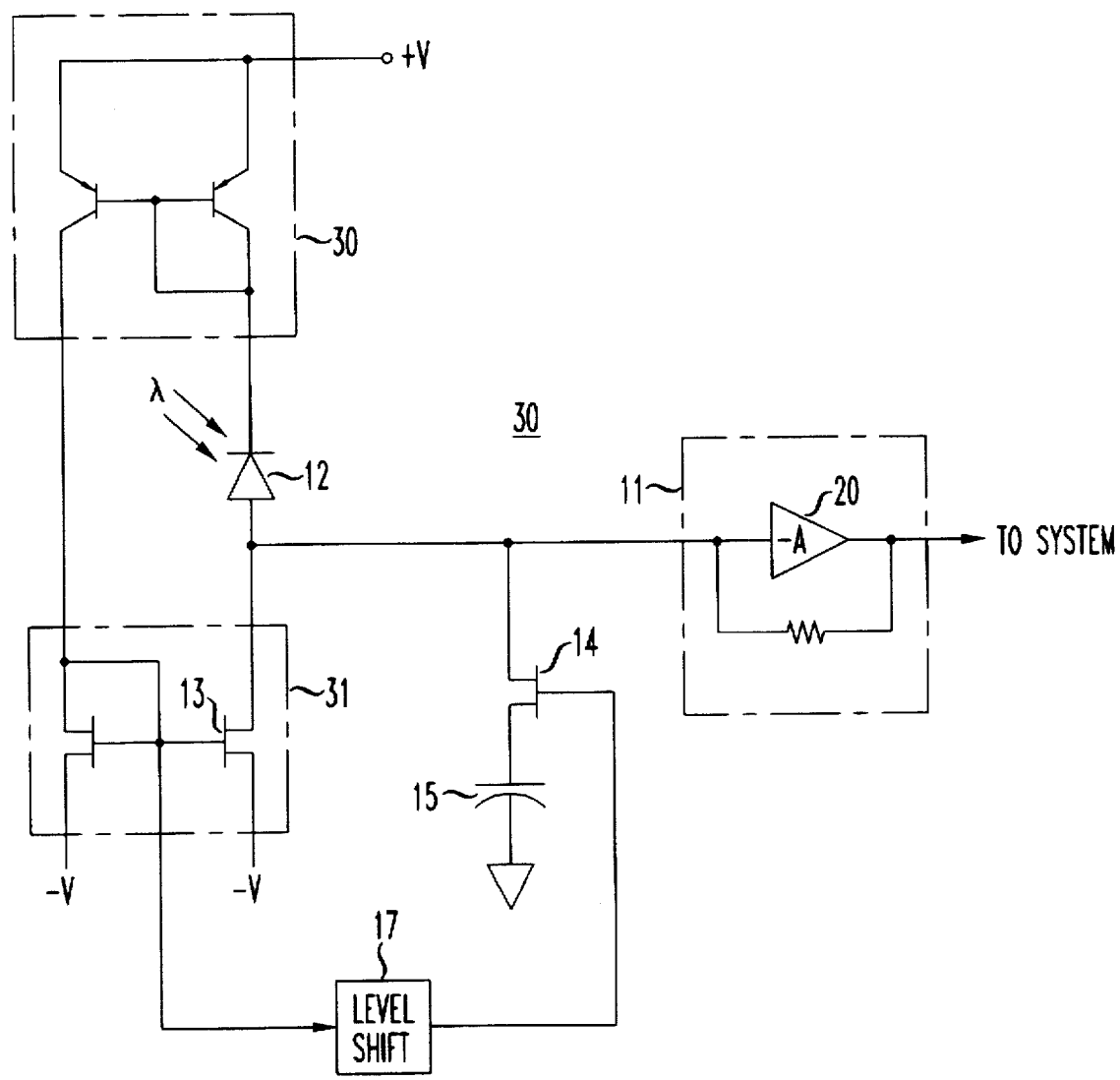
FIG. 3 is an exemplary block diagram of a preamplifier in an optical receiver which is part of an optical communication system, according to an alternative embodiment of the invention.

In FIG. 3 an alternative exemplary embodiment of the invention is shown. Here, the current in the device 12 is sensed by exemplary current mirror 30 driving an exemplary current mirror 31. The output of FETs 13 and 14 operate in substantially the same way as that in FIG. 1 but without the need for circuitry 16 of FIG. 1.

Another embodiment of the invention has common gates and sources for FETs 13 and 14, with the capacitor 15 disposed between the drain of FET 14 and the input of the preamplifier 11. This makes the gate-to-source voltages identical for both devices and eliminates the need for level shifter 17. However, placing the capacitor 15 with both terminals thereof above ground may not be practical in many situations because the capacitor 15 is physically large and not integrated into the same substrate as the rest of the circuitry.

While the devices and circuits shown are exemplary, other topologies may be used to achieve the same results. For example, while FETs are shown, bipolar transistor transistors may be substituted and vice-versa to the extent such substitutions can be done. Further, voltage and current polarities can be reversed with the appropriate change in polarity for the active devices.

EXEMPLARY RESULTS

An optical receiver in accordance with FIGS. 1 and 2 have been fabricated on a GaAs integrated circuit with two external operational amplifiers (22 and 27, FIG. 2). FET 13 is a 40 micron wide, 1 micron long N-channel heterojunction FET (GaAs/AlGaAs). FET 14 is a 100 micron wide, 1 micron long N-channel heterojunction FET. Both FETs (and the amplifier 20, FIG. 1) are formed using the technology disclosed in U.S. Pat. No. 5,041,393, assigned to the same assignee as this invention and incorporated herein by reference. The resulting preamplifier 11 has a transimpedance of 4200 ohms, handling an input signal from 10 μA peak-to-peak to 6 mA peak-to-peak without overload, at 2.5 Gb/s.

Having described the preferred embodiment of this invention, it will now be apparent to one of skill in the art that other embodiments incorporating its concept may be used. Therefore, this invention should not be limited to the disclosed embodiment, but rather should be limited only by the spirit and scope of the appended claims.

I claim:

1. In an optical receiver, a preamplifier circuit responsive to a signal from an electro-optical detector coupling to an input of the preamplifier, the signal having a DC portion and an AC portion, comprising:

a variable DC shunt path coupling to the input of the preamplifier, the amount of current shunted being proportional to the DC portion of the signal from the detector; and, a variable impedance AC shunt path, separate from the DC shunt path, coupling to the input of the preamplifier, the impedance being proportional to the DC portion of the signal from the detector.

2. The optical receiver recited in claim 1, wherein the variable DC shunt path comprises a variable current sink.

3. The optical receiver recited in claim 2, wherein the variable impedance AC shunt path is formed by a series combination of a DC-blocking capacitor and an FET operating in the triode region.

4. The optical receiver recited in claim 3, wherein the variable DC shunt path is an FET operating in the saturated region.

5. The optical receiver recited in claim 4, wherein the DC shunt FET and the AC shunt FET have substantially the same gate-to-source voltage.

6. The optical receiver recited in claim 5, wherein the DC shunt path shunts substantially the entire DC portion of the signal away from the preamplifier input.

7. The optical receiver recited in claim 6, wherein the preamplifier comprises:

an amplifier having an output and an input, the input coupling to the detector;

and a feedback impedance coupling between the input and the output of the amplifier.

8. The optical receiver recited in claim 7, wherein the DC portion of the signal is determined from a voltage developed across the feedback impedance.

9. The optical receiver recited in claim 6, wherein the DC portion of the signal is determined from a current mirror disposed in series with the photodiode.

10. The optical receiver recited in claim 5, wherein the detector is a photodiode.

11. The optical receiver recited in claim 1, wherein the optical receiver is part of an optical communication system.

12. A method of enhancing the dynamic range of an optical receiver preamplifier in an optical system, the receiver having an electro-optical detector coupling to the input of the preamplifier, the preamplifier amplifying a signal from the detector, the signal having a DC portion, and an AC portion, comprising the steps of:

shunting along a first path a DC current away from the input of the preamplifier, using an FET biased in saturation to provide the shunting; and, shunting along a second path an AC signal away from the input of the preamplifier, the shunted signal being in proportion to the DC portion of the signal from the detector.

13. The method as recited in claim 12, wherein the preamplifier includes:

an amplifier having an output and an input, the input coupling to the detector; and and a feedback impedance coupling between the input and the output of the amplifier;

and further comprising the step of measuring the average value of a voltage developed across the feedback resistor;

wherein the detected voltage controls the amount of DC and AC shunting.

14. The method as recited in claim 13, wherein substantially all of the DC component of the signal from the detector is shunted by the DC shunt path.

15. The method as recited in claim 12, further comprising the step of measuring the average value of the current flowing in the detector;

wherein the detected current controls the amount of DC and AC shunting.

16. The method as recited in claim 15, wherein substantially all of the DC component of the signal from the detector is shunted by the DC shunt path.

* * * * *